United States Patent
Song et al.

(10) Patent No.: US 9,627,376 B2
(45) Date of Patent: Apr. 18, 2017

(54) SEMICONDUCTOR DEVICE WITH ACTIVE FINS SEPARATED BY SHALLOW AND DEEP TRENCH ISOLATIONS AND METHOD FOR FABRICATING THE SAME

(71) Applicants: Tae-Joong Song, Seongnam-si (KR); Jae-Ho Park, Suwon-si (KR); Kang-Hyun Baek, Yongin-si (KR)

(72) Inventors: Tae-Joong Song, Seongnam-si (KR); Jae-Ho Park, Suwon-si (KR); Kang-Hyun Baek, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 48 days.

(21) Appl. No.: 14/281,224

(22) Filed: May 19, 2014

(65) Prior Publication Data

US 2014/0374828 A1 Dec. 25, 2014

(30) Foreign Application Priority Data

Jun. 21, 2013 (KR) .................. 10-2013-0071803

(51) Int. Cl.
*H01L 27/088* (2006.01)
*H01L 29/66* (2006.01)
*H01L 27/108* (2006.01)
*H01L 27/11* (2006.01)
*H01L 27/12* (2006.01)

(52) U.S. Cl.
CPC .... *H01L 27/0886* (2013.01); *H01L 27/10826* (2013.01); *H01L 27/10879* (2013.01); *H01L 27/1108* (2013.01); *H01L 27/1211* (2013.01); *H01L 29/6681* (2013.01)

(58) Field of Classification Search
CPC ............ H01L 27/0886; H01L 27/0924; H01L 27/1211; H01L 27/1108; H01L 27/10826; H01L 27/10879
See application file for complete search history.

(56) References Cited

U.S. PATENT DOCUMENTS

| | | | |
|---|---|---|---|
| 7,084,461 B2 | 8/2006 | Anderson et al. | |
| 7,829,951 B2 | 11/2010 | Song et al. | |
| 7,894,256 B1* | 2/2011 | Nemati .................. | G11C 11/39 365/174 |
| 2009/0206443 A1* | 8/2009 | Juengling ..................... | 257/506 |
| 2011/0220980 A1* | 9/2011 | Parekh et al. ................ | 257/302 |
| 2011/0223735 A1* | 9/2011 | Yu et al. ....................... | 438/299 |
| 2012/0113708 A1 | 5/2012 | Jung et al. | |
| 2012/0126884 A1* | 5/2012 | Juengling ..................... | 327/581 |
| 2013/0178043 A1* | 7/2013 | Cheng et al. ................ | 438/400 |
| 2014/0315371 A1* | 10/2014 | Cai et al. ...................... | 438/424 |

* cited by examiner

*Primary Examiner* — Kevin Parendo
(74) *Attorney, Agent, or Firm* — Lee & Morse, P.C.

(57) ABSTRACT

A semiconductor device includes first and second memory cell regions adjacent to each other on a substrate. At least one active base and a shallow trench isolation may be sequentially laminated at a boundary between the first and second memory cell regions. First and second active fins are formed on respective sides of the shallow trench isolation, and the first and second active fins projecting from the active base. At least one deep trench isolation is formed on one side of the active base.

10 Claims, 17 Drawing Sheets

1200

1300

1400

SEMICONDUCTOR DEVICE WITH ACTIVE FINS SEPARATED BY SHALLOW AND DEEP TRENCH ISOLATIONS AND METHOD FOR FABRICATING THE SAME

CROSS-REFERENCE TO RELATED APPLICATION

Korean Patent Application No. 10-2013-0071803, filed on Jun. 21, 2013, and entitled, "Semiconductor Device and Method For Fabricating The Same," is incorporated by reference herein in its entirety.

BACKGROUND

1. Field

One or more embodiments described herein relate to a semiconductor device.

2. Description of the Related Art

Semiconductor devices have been developed to operate at relatively faster speeds and lower voltages in order to meet the operational requirements of various programs, applications, and functions. Also, processes for fabricating these devices have been developed to improve reliability and integrity.

In some instances, the improved integrity may cause the occurrence of a short channel effect in a field effect transistor (FET). In an attempt to overcome this effect, so-called fin field effect transistors (FinFET) have been developed. These types of transistors have channels with a three-dimensional (3D) spatial structure.

SUMMARY

In accordance with one or more embodiments, a semiconductor device includes first and second memory cell regions adjacent to each other on a substrate; at least one active base and a shallow trench isolation sequentially laminated at a boundary between the first and second memory cell regions; first and second active fins on respective sides of the shallow trench isolation, the first and second active fins projecting from the active base; and at least one deep trench isolation on one side of the active base. A width of the active base may be larger than a width of each of the first and second active fins.

The semiconductor device may include a plurality of active bases, wherein the first and second active fins may be separated by the shallow trench isolation and wherein at least two of the plurality of active bases may be separated by the deep trench isolation.

The semiconductor device may include a gate electrode, wherein the first and second active fins may extend in a first direction along the boundary between the first and second memory cell regions, and wherein the gate electrode may extend from the first and second active fins in a second direction that crosses the first direction.

Agate insulating film may be between the gate electrode and the first and second active fins, and a spacer may be on at least one side of the gate electrode, wherein the gate insulating film may extend along a side wall of the spacer. The gate electrode may include a gate metal and a work function metal.

The semiconductor device may include a source region and a drain region respectively formed on the first and second active fins adjacent to the gate electrode, wherein upper surfaces of the source region and the drain region may be higher than a lower surface of the gate insulating film. A part of at least one of the source region or the drain region may extend into a lower portion of the spacer.

The substrate may be an insulating substrate. A same type of memory device may be included in the first memory cell region and in the second memory cell region. The memory device may include a static random access memory.

In accordance with another embodiment, a semiconductor device includes first and second memory cell regions arranged adjacent to each other on a substrate; odd-numbered active fins respectively formed in the first and second memory cell regions; and a plurality of active bases on the substrate at lower portions of the odd-numbered active fins, each of the active bases having a width greater than a width of each of the odd-numbered active fins, wherein the first memory cell region and the second memory cell region share at least one of the active bases.

The semiconductor device may include a shallow trench isolation at a boundary between the first and second memory cell regions and a deep trench isolation arranged at least two of the active bases in the first and second memory cell regions. The odd-numbered active fins may be separated from each other by the shallow trench isolation, and adjacent ones of the active bases may be separated from each other by the deep trench isolation.

Static random access memory (SRAM) devices may be in the first and second memory cell regions. The SRAM devices may include eight transistors. Transistors arranged adjacent to a boundary between the first and second memory cell regions may include at least two active fins. A size of a first transistor adjacent to a boundary between the first and second memory cell regions may be larger than a size of a second transistor that is spaced a greater distance from the boundary than the first transistor.

A first transistor may include one of the odd-numbered active fins, a second transistor may include two of the odd-numbered active fins, and a third transistor may include three of the odd-numbered active fins. The third transistor may be adjacent to a boundary between the first and second memory cell regions.

The first transistor may include a pull-up transistor, the second transistor may include a pull-down transistor and a selection transistor, and the third transistor may include a drive transistor and a pass transistor.

The semiconductor device may include a plurality of gate electrodes on the odd-numbered active fins to cross the odd-numbered active fins, wherein the odd-numbered active fins may include nine active fins and wherein the plurality of gate electrodes may include five gate electrodes.

In accordance with another embodiment, a method of fabricating a semiconductor device includes providing a substrate which includes first and second memory cell regions adjacent to each other; forming a dummy structure at a boundary between the first and second memory cell regions on the substrate; forming dummy spacers on respective sides of the dummy structure; exposing an upper surface of the substrate by removing the dummy structure; and forming a first active fin in the first memory cell region and a second active fin in the second memory cell region through etching of the substrate using the dummy spacers as a mask.

The method may include forming an active base on lower portions of the first and second active fins, wherein forming the active base include etching a part of the substrate in the first memory cell region and a part of the substrate in the second memory cell region. The active base may be arranged at the boundary between the first and second memory cell regions.

In accordance with another embodiment, a semiconductor device includes an active base; at least one trench isolation; a first active fin on the base; and a second active fin on the base adjacent to the first active fin, wherein the first active fin is located in a first memory cell region and the second active fin is located in a second memory cell region adjacent the first memory cell region, wherein a boundary between the first and second memory cell regions is between the first and second active fins, and wherein the active base and at least one trench isolation are laminated at a boundary between the first and second memory cell regions.

A width of the active base may be greater than widths of each of the first and second active fins. The at least one trench isolation may be between the first and second active fins. Another trench isolation may be adjacent a side of the active base. The first active fin may include a channel of a first transistor, and the second active fin may include a channel of a second transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
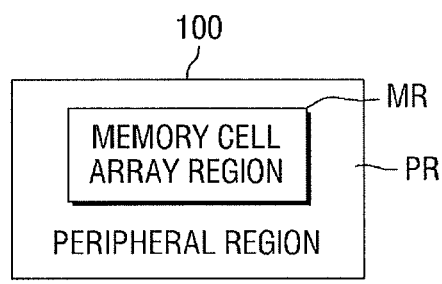
FIG. 1 illustrates an embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
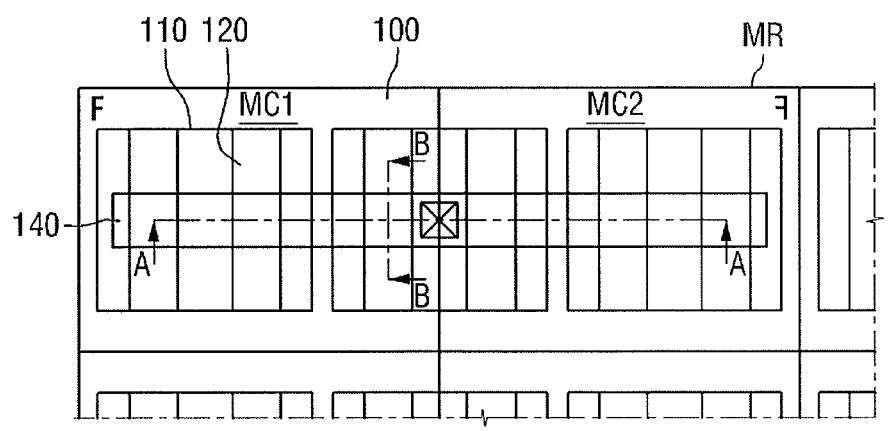
FIG. 2 illustrates part of a memory cell array region in FIG. 1.
Figure 3:
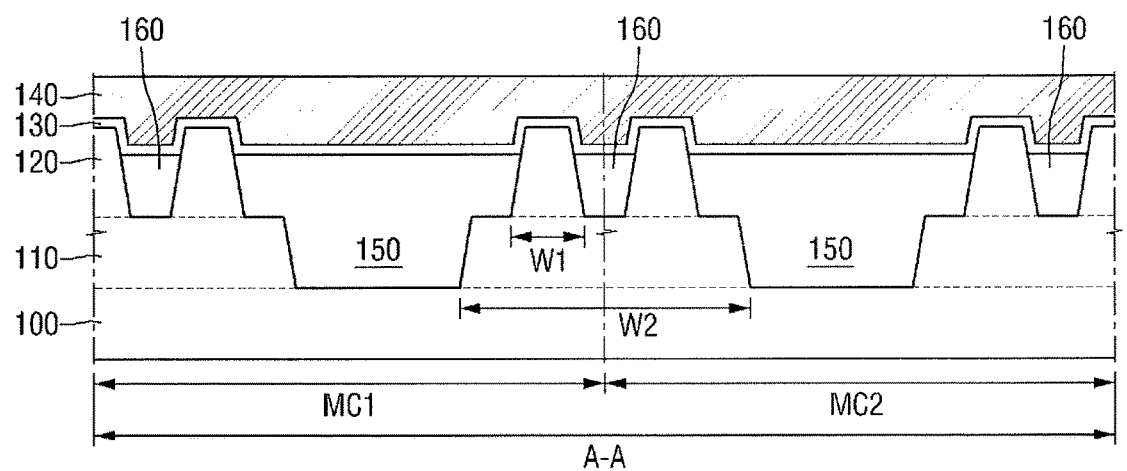
FIG. 3 illustrates a view along section line A-A in FIG. 2.
Figure 4:
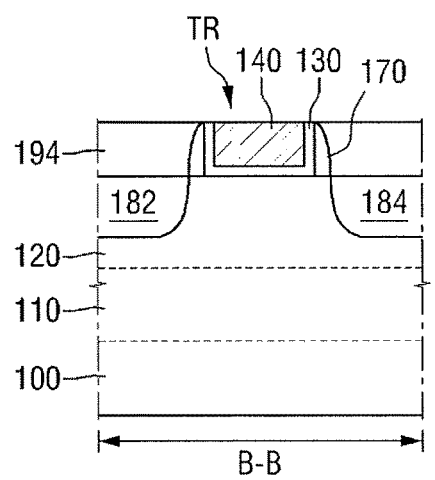
FIG. 4 illustrates a view along section line B-B of FIG. 2.

FIG. 1 illustrates an embodiment of a semiconductor device 1. FIG. 2 illustrates a part of a memory cell array region in FIG. 1. FIG. 3 illustrates a cross-sectional view of the memory cell region in FIG. 2 taken along line A-A. FIG. 4 illustrates a cross-sectional view of the memory cell region in FIG. 2 taken along line B-B.

Referring to FIG. 1, semiconductor device 1 includes a memory cell array region MR and a peripheral circuit region PR on a substrate 100. One or more memory devices may be arranged in the memory cell array region MR. Examples of these memory devices include an SRAM (Static Random Access Memory), a DRAM (Dynamic Random Access Memory), a NAND or NOR flash memory, an MRAM (Magnetic Random Access Memory), a PRAM (Phase change Random Memory), and a RRAM (Resistive Random Access Memory).

One or more devices for driving the memory devices in memory cell array region MR may be arranged in the peripheral circuit region PR. Examples of the driving devices include an input/output (I/O) buffer, a read circuit, and a write circuit.

Referring to FIGS. 2 to 4, a plurality of memory cell regions MC1 and MC2 may be arranged in the memory cell array region MR. The memory cell regions MC1 and MC2 may be aligned in a lattice shape and arranged in the form of an array.

In this case, the same memory devices may be arranged in the first memory cell region MC1 and the second memory cell region MC2. The second memory cell region MC2 may be adjacent to the first memory cell region MC1. Further, the first and second memory cell regions MC1 and MC2 may be arranged symmetrically. Specifically, the same memory devices may be formed in the first memory cell region MC1 and the second memory cell region MC2, and the memory devices formed in the first memory cell region MC1 and the second memory cell region MC2 may be symmetrically arranged based on the boundary between them.

Hereinafter, the first memory cell region MC1 and the second memory cell region MC2 will be described in detail. The following description can be applied to other memory cell regions in the same manner.

Each of the memory devices in the first memory cell region MC1 and the second memory cell region MC2 may include active bases 110 arranged on the substrate 100, active fins 120 arranged on the active base 110, a gate insulating film 130, and a gate electrode 140 arranged on the active fins 120. Two or more of these features may be sequentially laminated.

The substrate 100 may be, for example, a semiconductor substrate made of, for example, one or more of Si, Ge, SiGe, GaP, GaAs, SiC, SiGeC, InAs, or InP.

The active bases 110 may be arranged on the substrate 100. The active bases 110 may be integrally formed with and made of the same material as the substrate 100. In other embodiments, the active bases may be formed on and/or made of a different material from substrate 100.

The active bases 110 may be separated from each other, for example, by a deep trench isolation (DTI) 150. The depth of the deep trench isolation 150 may be greater than the depth of a shallow trench isolation (STI) 160, to be described below.

Pairs of active fins 120 are formed on respective ones of the active bases 110. The active fins 120 may be arranged to extend in a first direction (e.g., Y direction).

Each active fin 120 may have a cross-sectional shape that is tapered, so that a width of the active fin 120 becomes wider from an upper portion to a lower portion. In other embodiments, the active fin may have a different shape. For example, a cross-sectional shape of the active fin 120 may have a rectangular shape or a rounded shape. In this latter case, one or more corner portions of the active fin 120 may be rounded off.

In one embodiment, the width W1 of the active fin 120 may be smaller than the width W2 of the active base 110 that corresponds to the lower portion of the active fin 120. In some embodiments, the active fins 120 may be grouped in pairs. The active fins 120 may be grouped in pairs to allow two active fins 120 to be formed from one dummy structure 112 (in FIG. 5) in a fabricating process to be described later.

In this embodiment, odd-numbered active fins 120 may be arranged in each of the first and second memory cell regions MC1 and MC2. FIG. 2 illustrates that three active fins 120 are arranged in each of the first and second memory cell regions MC1 and MC2. However, a different number of active fins 120 (e.g., 5, 9, 11, etc.) may be arranged in each of the memory cell regions in other embodiments.

The active fins 120 in each pair may be separated from each other by the shallow trench isolation 160. The shallow trench isolation 160 may be formed to surround parts of the active fins 120. In one embodiment, the shallow trench isolation 160 may be arranged to surround lower portions of the active fins 120.

In some embodiments, the shallow trench isolations 160 may include the same material as the material of the deep trench isolation 150. Specifically, the shallow trench isolation 160 and the deep trench isolation 150 may be made of an insulating film. More specifically, the shallow trench isolation 160 and the deep trench isolation 150 may be made of oxide, nitride, oxynitride, or a combination thereof. Examples of materials that form the shallow trench isolation 160 and the deep trench isolation 150 may include silicon oxide (SiO2), silicon nitride (SiN), and silicon oxynitride (SiON).

In some embodiments, the active fins 120 may be integrally formed with the substrate 100. Specifically, the active fins 120 may be formed through etching of the substrate 100 that is made of a semiconductor material.

In some embodiments, the active fin 120 may be used as channels of a transistor TR (in FIG. 4). For example, channels may be formed along three sides of the active fin 120. In other embodiments, the channels of the transistor TR (in FIG. 4) may be formed on two opposing sides of the active fin 120.

On the active fin 120, a gate insulating film 130 and a gate electrode 140 may be sequentially laminated and arranged along a second direction (e.g., X direction) that crosses a first direction (e.g., Y direction).

As illustrated in FIG. 3, the gate insulating film 130 may extend in the second direction (e.g., X direction) and may be arranged to cover part of an upper portion of the active fin 120. Further, the gate insulating film 130 may be arranged to extend to the upper portion along side walls of spacers 170 arranged on respective sides of the gate electrode 140, as illustrated in FIG. 4.

In this embodiment, the gate insulating film 130 may have the above-described shape because the gate insulating film 130 may be formed through a replacement process (or a gate last process). In other embodiments, the gate insulating film 130 may have a different shape. For example, in some embodiments, as a result of gate first process, the gate insulating film 130 may not extend to the upper portion along the side walls of the spacers 170, but rather may be arranged on the lower portion of the gate electrode 140 as illustrated in FIG. 4.

The gate insulating film 130 may be made of, for example, a high-k material. In some embodiments, the gate insulating film 130 may be made of, for example, $HfO_2$, $Al_2O_3$, $ZrO_2$, or $TaO_2$.

An interface film may be included between the gate insulting film 130 and the active find 120 in order to prevent an inferior interface from forming between the gate insulating film 130 and the active fin 120. The interface film may include a low-k material layer having a dielectric constant k equal to or lower than 9. For example, the interface film may be or include a silicon oxide film (where, k is approximately 4) or a silicon oxynitride film (where, k is approximately 4 to 8 depending on the contents of oxygen atoms and nitrogen atoms). Further, the interface film may be made of silicate, or may be made of a combination of the aforementioned films.

The gate electrode 140 may be arranged in parallel with the gate insulating film 130 along the second direction (e.g., X direction). The gate electrode 140 may include a conductive material. In some embodiments, the gate electrode 140 may include a metal having high conductivity, but this is not a necessity.

The spacer 170 may be arranged on at least one side of the gate electrode 140. As illustrated in FIG. 4, in one embodiment spacers 170 may be arranged on respective sides of gate electrode 140. FIG. 4 illustrates that one side surface of the spacer 170 is curved. However, in other embodiments, the shape of the spacer 170 may be different. For example, in some embodiments, the spacer 170 may have an "I" or an "L" shape.

As illustrated in FIG. 4, source region 182 and drain region 164 are arranged on respective sides of the gate electrode 140 on active fin 120. Also, upper surfaces of the source region 182 and the drain region 184 may be formed at a same height as the upper surface of the active fin 120. In some embodiments, the upper surfaces of the source region 182 and the drain region 184 may have a height different from the height of the upper surface of the active fin 120.

An interlayer insulating film 194 may be arranged on the source region 182 and the drain region 184. The interlayer insulating film 194 may be an oxide film, a nitride film, an oxynitride film, or a combination thereof. Examples of materials that form the interlayer insulating film 194 may include silicon oxide (SiO2), silicon nitride (SiN), and silicon oxynitride (SiON).

In one embodiment, the active fins 120, the gate insulating film 130, and the gate electrode 140 that cover part of the upper portions of the active fins 120, the spacers 170 arranged on respective sides of the gate electrode 140, the source regions 182, and the drain regions 184 may form transistors TR. The transistors TR may perform specific functions in memory devices in the respective memory cell regions MC1 and MC2. For example, some of the transistors TR may be used as data storage devices, and others of the transistors TR may be used as control devices that control the operation of the memory devices.

In one embodiment, the active base 110 and shallow trench isolation 160 may be sequentially laminated and arranged on the boundary of the first memory cell region MC1 and the second memory cell region MC2, as illustrated in FIG. 3. In other words, the first memory cell region MC1 and the second memory cell region MC2 may share any one of the active bases 110. According to this structure, a size of the semiconductor device 1 may be reduced or miniaturized.

Figure 5:
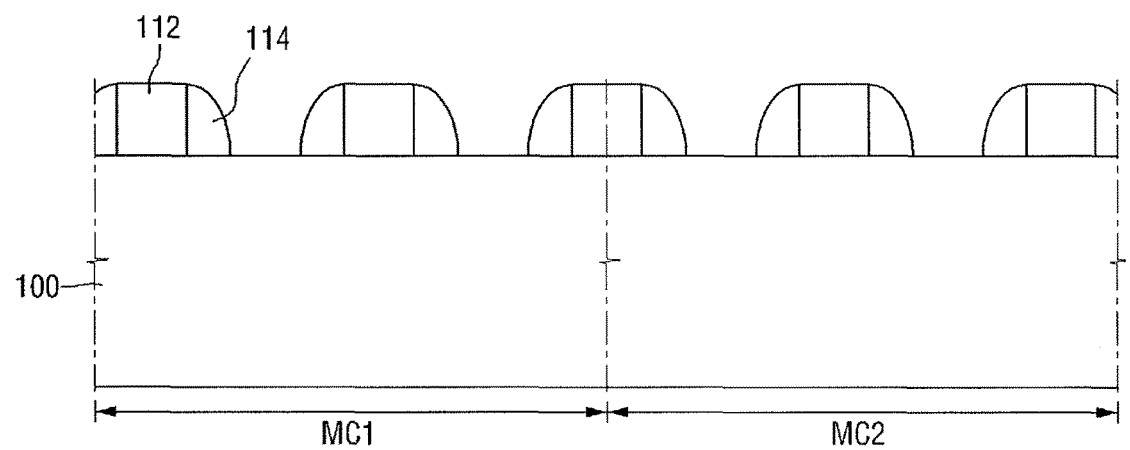
FIGS. 5 to 8 illustrate operations included in one embodiment of a method for fabricating a semiconductor device.

FIGS. 5 to 8 illustrate operations included in one embodiment of a method for fabricating a semiconductor device. Referring to FIG. 5 dummy structures 112 and dummy spacers 114 are formed on a substrate 100. Specifically, a first insulating film is formed on the substrate 100 using a CVD or PECVD process. Then, the first insulating film formed on substrate 100 is patterned to form the dummy structures 112. In one embodiment, the dummy structure 112 may be formed on the boundary between the first memory cell region MC1 and the second memory cell region MC2. The dummy structure 112 may be, for example, an oxide film, a nitride film, an oxynitride film, or a combination thereof.

Then, a second insulating film is formed on the dummy structures 112 to cover the dummy structures 112. Then, through patterning of the second insulating film on the dummy structures 112, dummy spacers 114 are formed on respective sides of the dummy structures 112. Forming the dummy spacers 114 may be performed using, for example, anisotropic etching.

In one embodiment, the dummy spacers 114 may be formed in the first memory cell region MC1 and the second memory cell region MC2. The dummy spacer 114 may be made of a material that is harder than the material of the dummy structure 112. For example, if the dummy structure 112 is made of an oxide film, the dummy spacer 114 may be made of an oxynitride film or another material film.

Figure 6:
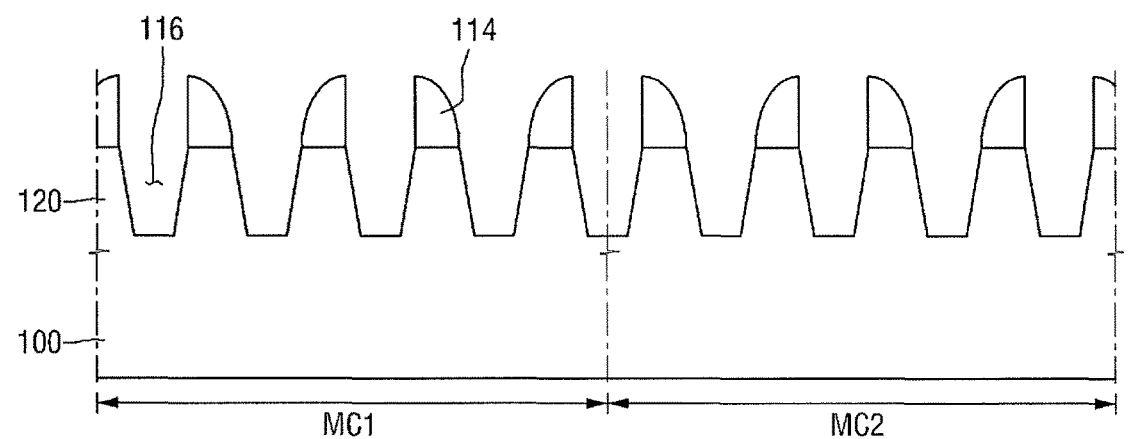

Referring to FIG. 6, the dummy structure 112 is removed to expose an upper surface of the substrate 100. Then, the active fins 120 are formed through etching of the exposed substrate 100 using the dummy spacers 114 as a mask. Etching the substrate 100 may be performed, for example, by anisotropic etching such as reactive ion etching.

Through the above-described processes, the active fins 120 are formed on the lower portions of the dummy spacers 114. Accordingly, the active fins 120 are formed in the first memory cell region MC1 and the second memory cell region MC2 in the same manner as the dummy spacers 114. However, the active fins may not be formed on the boundary between the first memory cell region MC1 and the second memory cell region MC2.

Figure 7:
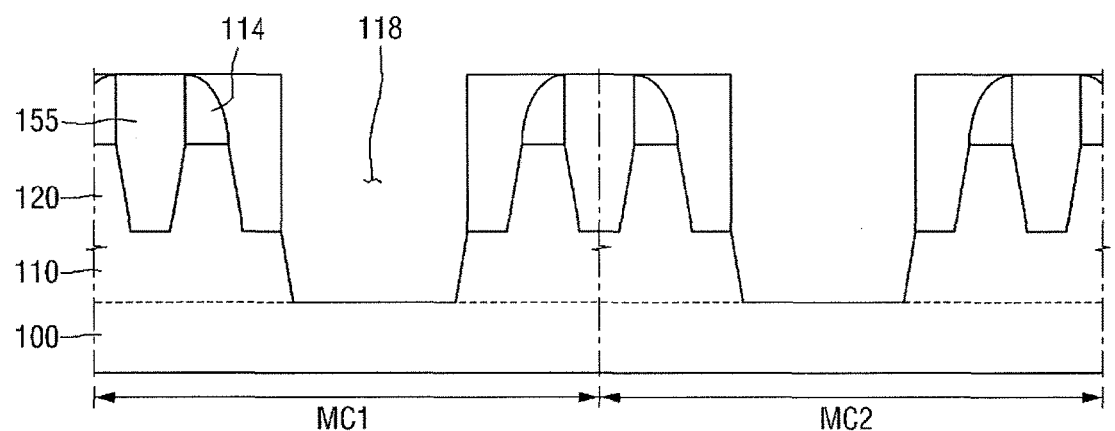

Referring to FIG. 7, a protection film 155 may be formed to cover the active fins 120 and the dummy spacers 114. Then, parts of the protection film 155, the active fins 120, and the dummy spacers 114 are etched to form the active base 110 on the boundary between the first memory cell region MC1 and the second memory cell region MC2. Through the above-described processes, the first memory cell region MC1 and the second memory cell region MC2 may share at least one of the active bases 110.

Figure 8:
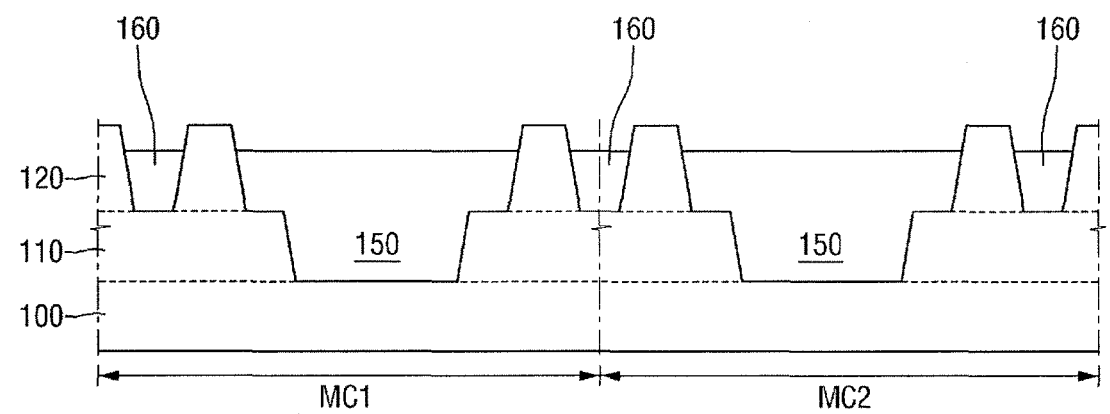

Referring to FIG. 8, a shallow trench isolation 160 is formed between the active fins 120, and a deep trench isolation 150 is formed between the active bases 150. The shallow trench isolation 160 and deep trench isolation 150 may include the same material. Specifically, the shallow trench isolation 160 and the deep trench isolation 150 may be formed of an insulating film. More specifically, the shallow trench isolation 160 and the deep trench isolation 150 may be formed of an oxide film, a nitride film, an oxynitride film, or a combination thereof. Examples of materials that may form the shallow trench isolation 160 and the deep trench isolation 150 may include silicon oxide (SiO2), silicon nitride (SiN), and silicon oxynitride (SiON).

Through the above-described fabricating processes, the shallow trench isolation 160 may be arranged on the boundary between the first memory cell region MC1 and the second memory cell region MC2. Also, the deep trench isolation 150 may be arranged inside the first memory cell region MC1 and second memory cell region MC2.

Next, referring to FIG. 3, a gate insulating film 130 and the gate electrode 140, which cover parts of upper portions of the active fins 120, are formed on the shallow trench isolation 160 and the deep trench isolation 150. In some embodiments, the gate insulating film 130 and the gate electrode 140 may be formed through, for example, a gate last process.

Although the active bases 110 may be formed after the active fins 120, this is not a necessity. In an alternative embodiment, the active bases 110 may be formed first, and then the active fins 120 may be formed on the active bases 110.

Figure 9:
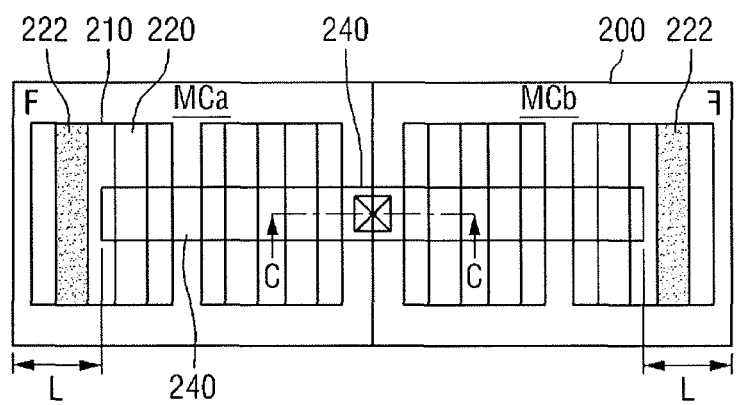
FIGS. 9 and 10 illustrate another semiconductor device.
Figure 10:
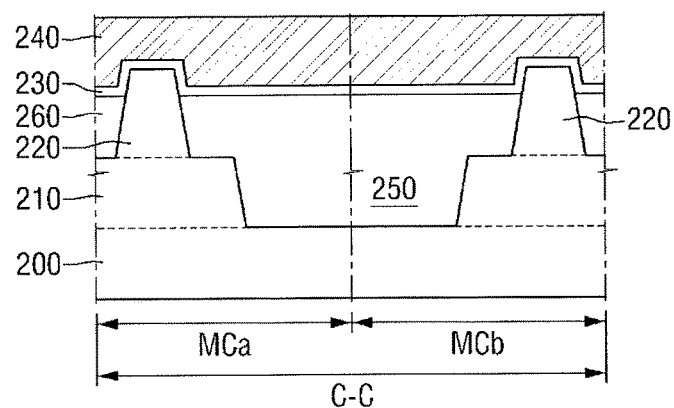

FIGS. 9 and 10 illustrate effects of another semiconductor device. More specifically, FIG. 9 illustrates a semiconductor device 99 that is different from the semiconductor device 1 illustrated in FIGS. 1 to 4. FIG. 10 is a cross-sectional view taken along line C-C of FIG. 9.

Referring to FIGS. 9 and 10, active bases 210 may be arranged on a substrate 200 of a semiconductor device 99. The active bases 210 are not arranged at a boundary between a first memory cell region MCa and a second memory cell region MCb. That is, in the semiconductor device 99, the first memory cell region MCa and the second memory cell region MCb do not share an active base 210. Accordingly, a deep trench isolation 250 may be arranged on the boundary between the first memory cell region MCa and the second memory cell region MCb.

Also, in the semiconductor device 99, active fins 220 and dummy active fins 222 may be arranged on the active bases 210. Further, the active fin 220 and the dummy active fin 222 may be separated from each other by shallow trench isolation 260. The gate insulating film 230 and a gate electrode 240 may be sequentially laminated on the active fins 220 and the dummy active fins 222.

The active fin 220 may be a fin that is used as a part of a memory device, but the dummy active fin 222 may be a fin that is not used as a part of the memory device. The dummy active fins 222 may exist in semiconductor device 99 because two active fins 220 are formed from one dummy structure 112, for example, as illustrated in FIG. 5.

More specifically, if odd-numbered active fins 220 are provided in one memory cell region (e.g., first memory cell region MCa), two active fins 220 are formed from one dummy structure 112 (in FIG. 5) as described above. Thus, any one of the formed active fins 220 becomes a dummy active fin 222 that is not used as a memory device. In this case, a region where the dummy active fin 222 is formed remains as an unnecessary region in the memory cell regions MCa and MCb.

However, in the case of semiconductor device 1 in FIGS. 1 to 4, the first memory cell region MC1 and the second memory cell region MC2 share one or more active bases 110. Thus, the dummy active fins 222 illustrated in FIGS. 9 and 10 do not exist in the first memory cell region MC1 and the second memory cell region MC2. Accordingly, unnecessary regions (e.g., regions indicated with a length L) illustrated in FIGS. 9 and 10 are eliminated. Also, areas of the respective memory cell regions MC1 and MC2 are decreased. Accordingly, miniaturization of the semiconductor device 1 becomes possible.

Figure 11:
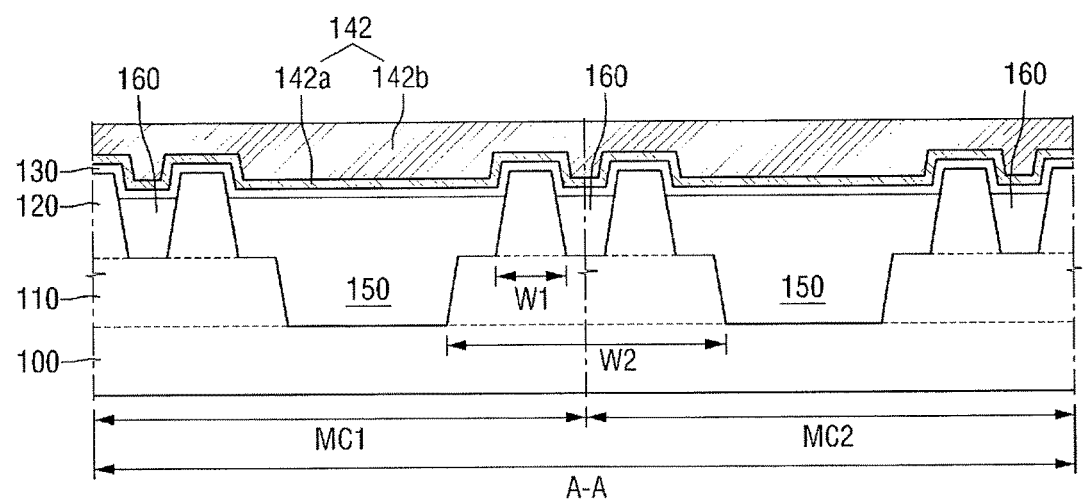
FIGS. 11 and 12 illustrate another embodiment of a semiconductor device.
Figure 12:
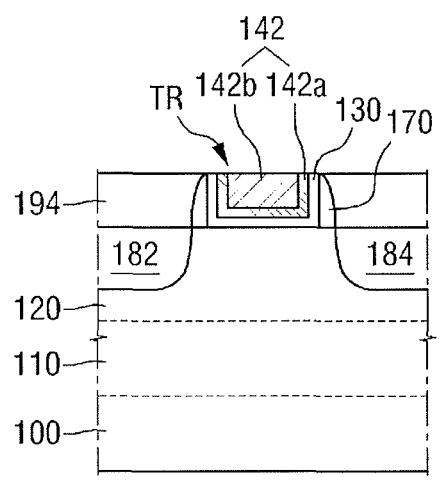

FIGS. 11 and 12 illustrate another embodiment of a semiconductor device 2 which includes a gate electrode 142, that may include a work function metal 142a and a gate metal 142b. The work function metal 142a may serve to adjust a work function, and gate metal 142b may serve to fill a space formed by the work function metal 142a.

The work function metal 142a may have a single layer structure including metal or a multilayer structure including a metal nitride film and metal. Examples of metals that form the work function metal 142a may include, for example, Al, W, Ti, or a combination thereof. The metal nitride film may include, for example, TiN, TaN, or a combination thereof.

The work function metal 142a may extend upwardly along side walls of spacers 170 arranged on respective sides of the gate insulating film 130 and gate metal 142b. The gate metal 142b may include metal having high conductivity. Examples of such metals include W and Al.

Figure 13:
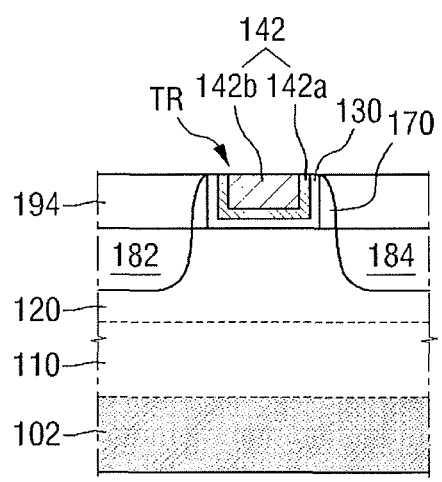
FIG. 13 illustrates another embodiment of a semiconductor device.

FIG. 13 illustrates another embodiment of a semiconductor device 3 which includes an SOI (Silicon On Insulator) substrate. Specifically, active fins 120 and active bases 110 may be formed by forming single crystalline silicon on a buried oxide film 102 and patterning the single crystalline silicon. In other words, in the semiconductor device 3, the active fin 120 and the active base 110 may be an epitaxial layer. Using a SOI substrate may reduce delay time in an operation process of semiconductor device 3.

Figure 14:
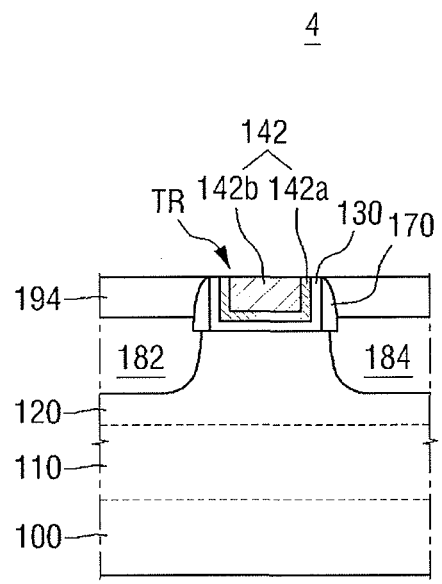
FIG. 14 illustrates another embodiment of a semiconductor device.

FIG. 14 illustrates another embodiment a semiconductor device 4 which includes a source region 182 and a drain region 184 having an elevated shape. That is, upper surfaces of the source region 182 and the drain region 184 may be formed to be higher than a lower surface of a gate insulating film 130. Further, in some embodiments, the upper surfaces of the source region 182 and the drain region 184 may be formed to be higher than a lower surface of a work function metal 142a.

Also, parts of the source region 182 and the drain region 184 may be formed to overlap spacers 170. That is, parts of the source region 182 and the drain region 184 may be in the shape of a tuck that is pushed into a lower portion of the spacer 170.

Figure 15:
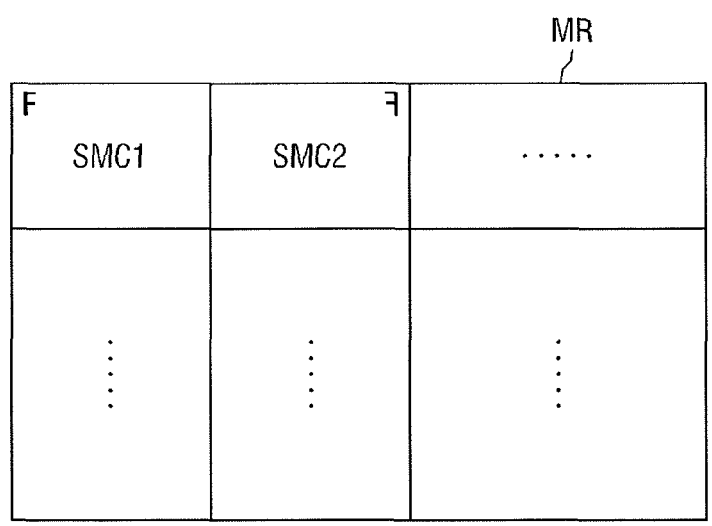
FIG. 15 illustrate another embodiment of a semiconductor device.
Figure 16:
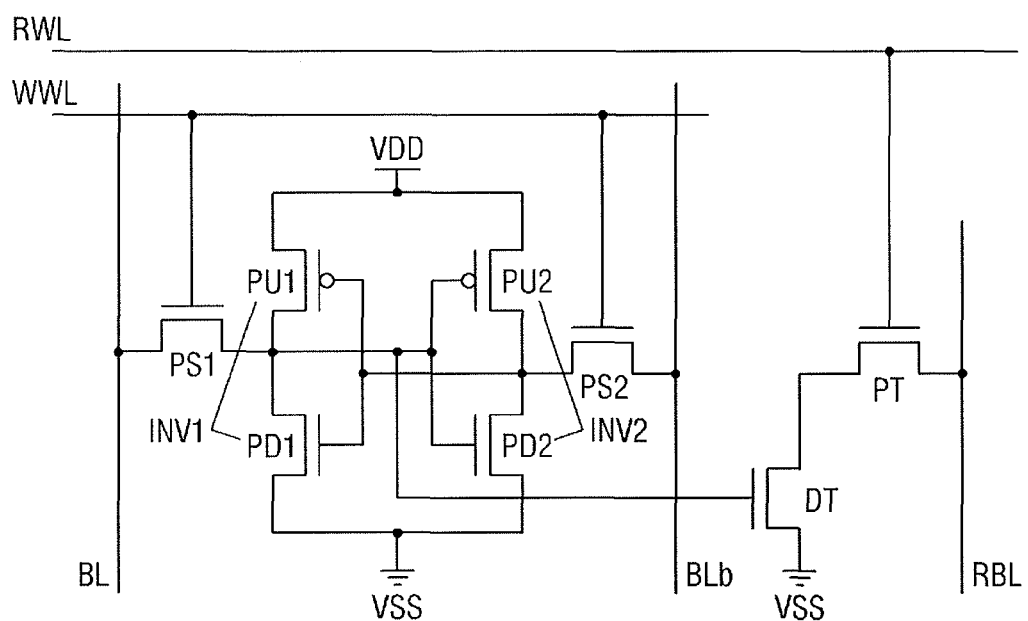
FIG. 16 illustrates an example of a first memory cell in FIG. 15.
Figure 17:
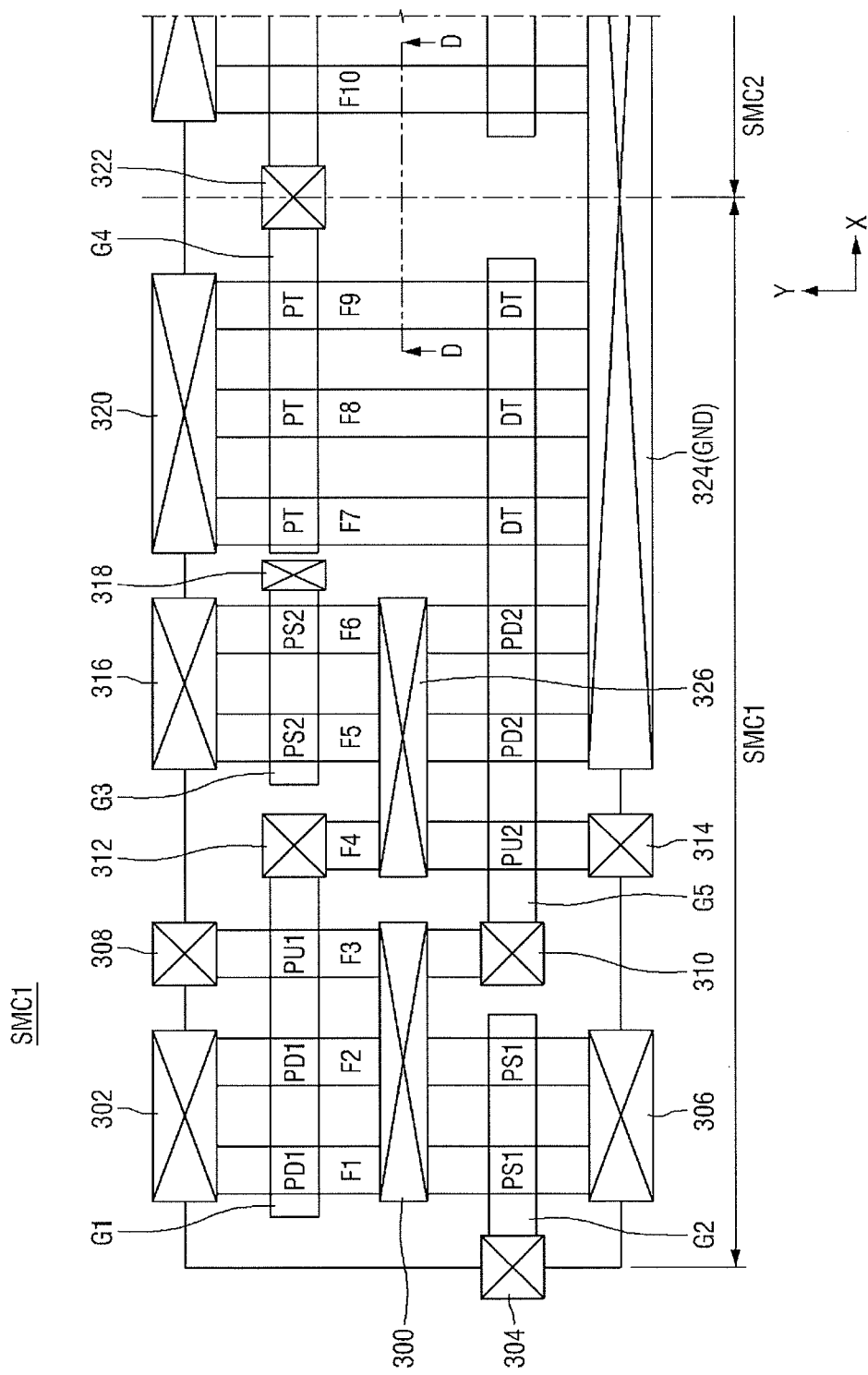
FIG. 17 illustrates a layout of the first memory cell in FIG. 15.
Figure 18:
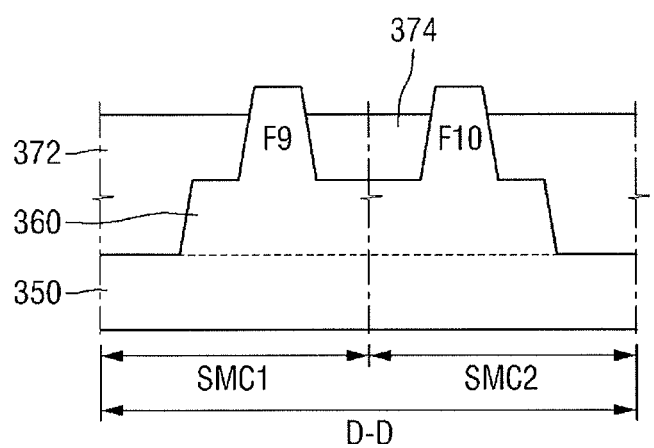
FIG. 18 illustrates a view along section line D-D in FIG. 17.

FIG. 15 illustrates another embodiment of a semiconductor device 5. FIG. 16 illustrates a circuit diagram of a first SRAM memory cell in FIG. 15. FIG. 17 illustrates a layout diagram of the first SRAM memory cell of FIG. 15. FIG. 18 illustrates a cross-sectional view taken along line D-D in FIG. 17. The SRAM devices may be arranged in respective memory cell array regions MR. Further, each SRAM device may be formed from 8 transistors.

Referring to FIG. 15, a plurality of SRAM memory cell regions SMC1 and SMC2 may be arranged in the memory cell array region MR of a semiconductor device 5. The plurality of SRAM memory cell regions SMC1 and SMC2 may be aligned in a lattice shape and arranged in the form of an array.

Referring to FIG. 16, the SRAM memory cell region (e.g., the first SRAM memory cell region SMC1) may include first and second inverters INV1 and INV2 connected in parallel between a power supply node Vcc and a ground node Vss, a first selection transistor PS1 and a second selection transistor PS2 connected to output nodes of the respective inverters INV1 and INV2, a drive transistor DT controlled by an output of the first inverter INV1, and a pass transistor PT connected to an output node of the drive transistor DT. That is, the SRAM memory cell region (e.g., the first SRAM memory cell region SMC1) may include an SRAM device that includes 8 transistors.

The first selection transistor PS1 and the second selection transistor PS2 may be connected to a bit line BL and a complementary bit line BLb, respectively. Gates of the first selection transistor PS1 and the second selection transistor PS2 may be connected to a write word line WWL.

The first inverter INV1 includes a first pull-up transistor PU1 and a first pull-down transistor PD1 connected in series. The second inverter INV2 includes a second pull-up transistor PU2 and a second pull-down transistor PD2. The first pull-up transistor PU1 and second pull-up transistor PU2 may be PFET transistors. The first pull-down transistor PD1 and second pull-down transistor PD2 may be NFET transistors.

Further, the first inverter INV1 and the second inverter INV2 may constitute one latch circuit. In this latch circuit, an input node of the first inverter INV1 may be connected to an output node of the second inverter INV2, and an input node of the second inverter INV2 may be connected to an output node of the first inverter INV1.

The drive transistor DT and the pass transistor PT may be used to read data stored in the latch circuit that includes the first inverter INV1 and the second inverter INV2. A gate of the drive transistor DT may be connected to the output node of the first inverter INV1, and a gate of the pass transistor PT may be connected to a read word line RWL. The output of the drive transistor DT may be connected to the ground node VSS, and an output of the pass transistor PT may be connected to a read bit line RBL.

Through the above-described circuit configuration, the data stored in the SRAM device can be accessed through two ports (e.g., double port). First, through selection of the write work line WWL, the bit line BL, and the complementary bit line BLb, data can be written in or can be read from the latch circuit that includes the first inverter INV1 and the second inverter INV2. Further, through selection of the read write line RWL and the read bit line RBL, the data stored in the latch circuit that includes the first inverter INV1 and the second inverter INV2 can be read. That is, this path may be used as a second port.

In the SRAM device described above, data reading based on the second port can be performed independently of the operation based on the first port. The data read operation, therefore, may exert no influence on the data stored in the latch circuit. In other words, reading of the data stored in the latch circuit and writing of the data in the latch circuit can be independently performed.

Referring to FIGS. 17 and 18, the SRAM memory cell region (e.g., the first SRAM memory cell region SMC1) may include nine active fins F1 to F9, five gate electrodes G1 to G5, and a plurality of contacts 300, 302, 304, 306, 308, 310, 312, 314, 316, 318, 320, 322, 324, and 326. The first to ninth active fins F1 to F9 may be arranged to extend in the first direction (e.g., Y direction).

The first gate electrode G1 may overlap the first to third active fins F1 to F3, and may be arranged to extend in the second direction (e.g., X direction). The first pull-down transistor PD1 may be formed in a region where the first and second active fins F1 and F2 cross the first gate electrode. The first pull-up transistor PU1 may be formed in a region where the third active fin F3 crosses the first gate electrode G1.

The source of the first pull-down transistor PD1 may be connected to the second contact 302. The second contact 302 may be connected to the ground node VSS. The source of the first pull-up transistor PU1 may be connected to the fifth contact 308. The fifth contact 308 may be connected to the power supply node VDD. The drain of the first pull-down transistor PD1 and the drain of the first pull-up transistor PU1 may be connected to the first contact 300. That is, the first pull-down transistor PD1 and the first pull-up transistor PU1 may share the first contact 300.

The first selection transistor PS1 may be formed in a region where the first and second active fins F1 and F2 cross the second gate electrode G2. The drain of the first selection transistor PS1 may be connected to the first contact 300. That is, the first pull-down transistor PD1, the first pull-up transistor PU1, and the first selection transistor PS1 may share the first contact 300. The source of the first selection transistor PS1 may be connected to the fourth contact 306. The fourth contact 306 may be connected to the bit line BL. The second gate electrode G2 may be connected to the third contact 304. The third contact 304 may be connected to the write word line WWL.

The first pull-down transistor PD1 and the first selection transistor PS1 may be formed using two active fins F1 and F2. The first pull-up transistor PU1 may be formed using one active fin F3. Accordingly, the size of the first pull-down transistor PD1 and the first selection transistor PS1 may be larger than the size of the first pull-up transistor PU1.

The sixth contact 310 may be connected to the first contact 300 through the third active fin F3. The sixth contact 310 may be connected to the fifth gate electrode G5. The fifth gate electrode G5 may be arranged to extend in the second direction (e.g., X direction) to cross the fourth to ninth active fins F4 to F9.

The second pull-up transistor PU2 may be formed in a region where the fourth active fin F4 and the fifth gate electrode G5 cross each other. The second pull-down transistor PD2 may be formed in a region where the fifth and sixth active fins F5 and F6 cross the fifth gate electrode G5. The drive transistor DT may be formed in a region where the seventh to ninth active fins F7 to F9 cross the fifth gate electrode G5.

As previously described, because the first contact 300 is connected to the fifth gate electrode G5 through the third active fin F3 and the sixth contact 310, outputs of the first pull-up transistor PU1, the first pull-down transistor PD1, and the first selection transistor PS1 may be applied to the gates of the second pull-up transistor PU2, the second pull-down transistor PD2, and the drive transistor DT.

The drain of the second pull-up transistor PU2 and the drain of the second pull-down transistor PD2 may be connected to the seventh contact 312 and the fourteenth contact 326. The seventh contact 307 may be connected to the first gate electrode G1. Accordingly, the output of the second pull-up transistor PU2 and the output of the second pull-down transistor PD2 may be applied to the gates of the first pull-up transistor PU1 and the first pull-down transistor PD1.

The source of the second pull-up transistor PU2 may be connected to the eighth contact 314. The eighth contact 314 may be connected to the power supply node VDD. The source of the second pull-down transistor PD2 and the source of the drive transistor DT may be connected to the thirteenth contact 324. Further, the thirteenth contact 324 may be connected to the ground node VSS.

The second selection transistor PS2 may be formed in a region where the fifth and sixth active fins F5 and F6 cross the third gate electrode G3, and the pass transistor PT may be formed in a region where the seventh to ninth active fins F7 to F9 cross the fourth gate electrode G4.

The source of the second selection transistor PS2 may be connected to the ninth contact 316. The ninth contact 316 may be connected to the complementary bit line BLb. The drain of the second selection transistor PS2 may be connected to the fourteenth contact 326. As previously described, because the fourteenth contact 326 is connected to the seventh contact 312 through the fourth active fin F4, the output of the second selection transistor PS2 may be applied to the gates of the first pull-up transistor PU1 and the first pull-down transistor PD1.

The third gate electrode G3 may be connected to the tenth contact 318. The tenth contact 318 may be connected to the write word line WWL. In other words, the tenth contact 318 and fourth contact 306 may be electrically connected to each other.

The source of the pass transistor PT may be connected to the eleventh contact 320. The eleventh contact 320 may be connected to the read bit lint RBL. The drain of the pass transistor PT may be connected to the drain of the drive transistor DT.

The fourth gate electrode G4 may be connected to the twelfth contact 322. The twelfth contact 322 may be connected to the read word line RWL. In this embodiment, the first SRAM memory cell region SMC1 and the second SRAM memory cell region SMC2 may share the twelfth contact 322 and the thirteenth contact 324. In other embodiments, the first SRAM memory cell region SMC1 and the second SRAM memory cell region SMC2 may not share any contact, but may be connected to the write word line WWL and the ground node VSS through separate contacts.

The drive transistor DT and the pass transistor PT may be formed using three active fins F7 to F9. The second pull-down transistor PD2 and the second selection transistor PS2 may be formed using two active fins F5 and F6. The second pull-up transistor PU2 may be formed using one active fin F4. Accordingly, the size of the drive transistor DT and the pass transistor PT may be larger than the size of the second pull-down transistor PD2 and the second selection transistor PS2. Also, the size of the second pull-down transistor PD2 and the second selection transistor PS2 may be larger than the size of the second pull-up transistor PU2.

In other words, according to one embodiment, the size of the transistor that is arranged on the boundary between the first SRAM memory cell region SMC1 and the second SRAM memory cell region SMC2 may be larger than the size of the transistor that is far apart from the boundary between the first SRAM memory cell region SMC1 and the second SRAM memory cell region SMC2.

Even in semiconductor device 5, the first SRAM memory cell region SMC1 and the second SRAM memory cell region SMC2 may share one or more active bases 360. In other words, an active base 360 may be formed on the boundary between the first SRAM memory cell region SMC1 and the second SRAM memory cell region SMC2.

The tenth active fin F10 may be arranged to extend in the first direction (e.g., Y direction) in the second SRAM memory cell region SMC2 that is adjacent to the boundary between the SRAM memory cell region SMC1 and the second SRAM memory cell region SMC2. A shallow trench isolation 374 that separates the ninth active fin F9 and the tenth active fin F10 may be arranged on the boundary between the SRAM memory cell region SMC1 and the second SRAM memory cell region SMC2. A deep trench isolation 372 that separates active bases 360 from each other may be arranged in the SRAM memory cell region SMC1 and the second SRAM memory cell region SMC2.

As previously described, if the SRAM memory cell region (e.g., the first SRAM memory cell region SMC1 includes nine active fins F1 to F9 and the adjacent SRAM memory cell regions (e.g., the SRAM memory cell region SMC1 and the second SRAM memory cell region SMC2) share the active base 360, the SRAM device can be miniaturized. Accordingly, the entire size of semiconductor device 5 can be reduced.

Figure 19:
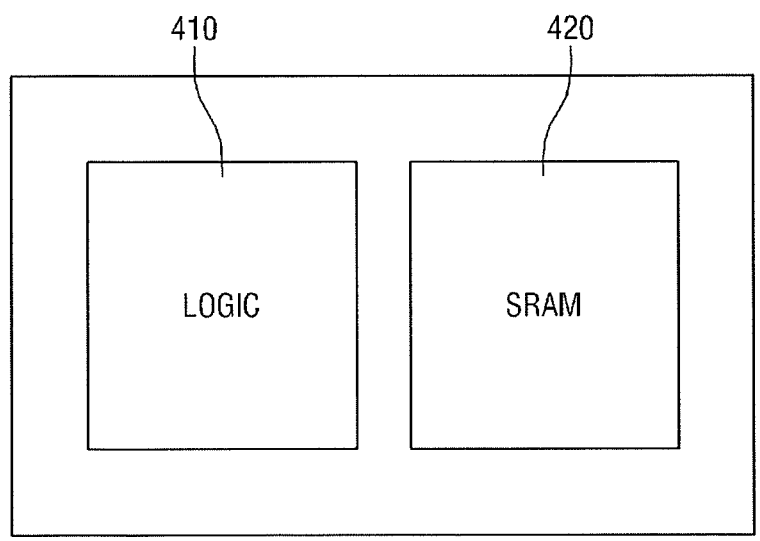
FIG. 19 illustrates another embodiment of a semiconductor device.

FIG. 19 illustrates an embodiment of a semiconductor device 6 which includes a logic region 410 and an SRAM forming region 420. Logic devices for operation of the semiconductor device 6 may be formed in the logic region 410. An SRAM device may be formed in the SRAM forming region 420. Any of the aforementioned embodiments of semiconductor devices 1 to 5 may be arranged in the SRAM forming region 420. In other embodiments, a combination of two or more of the aforementioned semiconductor devices 1 to 5 may be arranged in SRAM forming region 420. In other embodiments, a device different from an SRAM device may be included in region 420. These devices include, for example, a DRAM, MRAM, RRAM, or PRAM. In this case, logic region 410 may include circuits that corresponds to these different type of memories.

Figure 20:
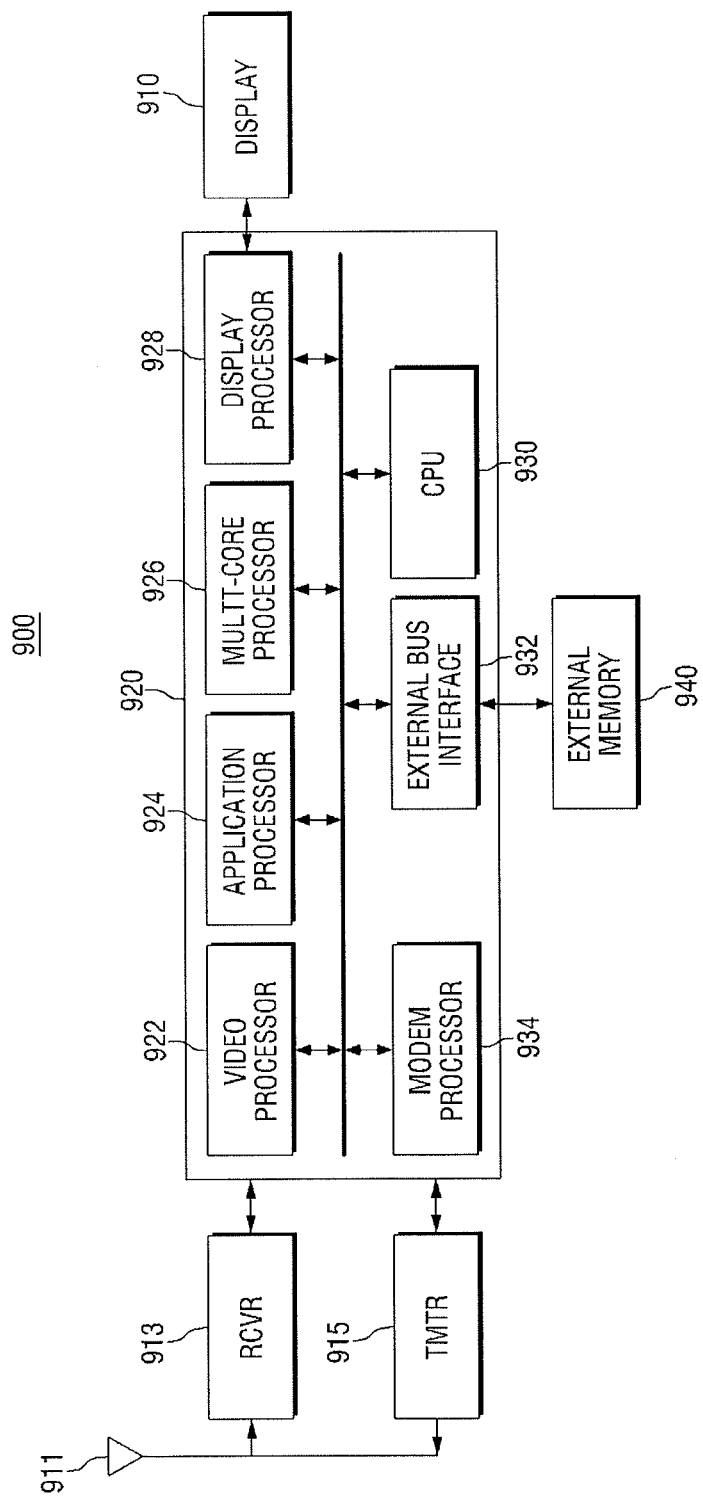
FIG. 20 illustrates a wireless communication device that includes any of the aforementioned embodiments of a semiconductor device.

FIG. 20, illustrates a wireless communication device 900 that may include a semiconductor device in accordance with any of the aforementioned embodiments. The communication device 900, for example, may be a cellular phone, a smart phone terminal, a handset, a personal digital assistant (PDA), a laptop computer, a video game unit, or another type of device. The device 900 may use, for example, code division multiple access (CDMA), time division multiple access (TDMA), such as a global system GSM for mobile communication, or another type of wireless communication standard including short-range, mid-range, and long range standards.

The device 900 may provide bi-directional communication through a reception path and a transmission path. Signals transmitted by one or more base stations on the reception path may be received through an antenna 911 or may be provided to a receiver (RCVR) 913. The receiver 913 may perform conditioning and digitalization of a received signal and provide samples to a digital section 920 for additional processing. On the transmission path, a transmitter (TMTR) 915 may receive data transmitted from the digital section 920, perform processing and conditioning of the data, and generate a modulated signal. The modulated signal may be transmitted to one or more base stations through the antenna 911.

The digital section 920 may be implemented by one or more digital signal processors (DSP), a microprocessor, and a reduced instruction set computer (RISC). Further, the digital section 920 may be fabricated on one or more application-specific integrated circuits (ASIC) or other types of integrated circuits (IC).

The digital section 920 may include, for example, various processing and interface unit, such as a modem processor 934, a video processor 922, an application processor 924, a display processor 928, a controller/multi-core processor 926, a central processing unit 930, and/or an external bus interface (EBI) 932.

The video processor 922 may be or include a graphics application processor. For example, the video processor 922 may include a certain number of processing units or modules for a certain set of graphic operations. A specific part of the video processor 922 may be implemented by firmware and/or software. For example, the control unit may be implemented by firmware and/or software modules (e.g., procedures or functions) for performing the above-described functions. Firmware and/or software codes may be stored in a memory, or may be executed by a processor (e.g., the multi-core processor 926). The memory may be implemented within or outside the processor.

The video processor 922 may implement a software interface, such as, for example, open graphic library (OpenGL) or Direct3D. The central processing unit 930 may perform a series of graphic processing operations together with the video processor 922. The controller/multi-core processor 926 may include at least two cores and allocate workloads to two cores (depending, for example, on the workloads which the controller/multi-core processor 926 is to process) for simultaneous processing.

The application processor 924 is illustrated as one constituent element in the digital section 920. In alternative embodiments, the digital section 920 may be implemented to be integrated into one application processor 924 or an application chip.

The modem processor 934 may perform necessary operations in a data transfer procedure between the digital section 920 and the receiver 913 or the transmitter 915. The display processor 928 may perform operations to drive the display 910.

The semiconductor devices 1 to 6 according to the embodiments described above may be used as cache memories or buffer memories used for operations of the processors 922, 924, 926, 928, 930, and 934.

Figure 21:
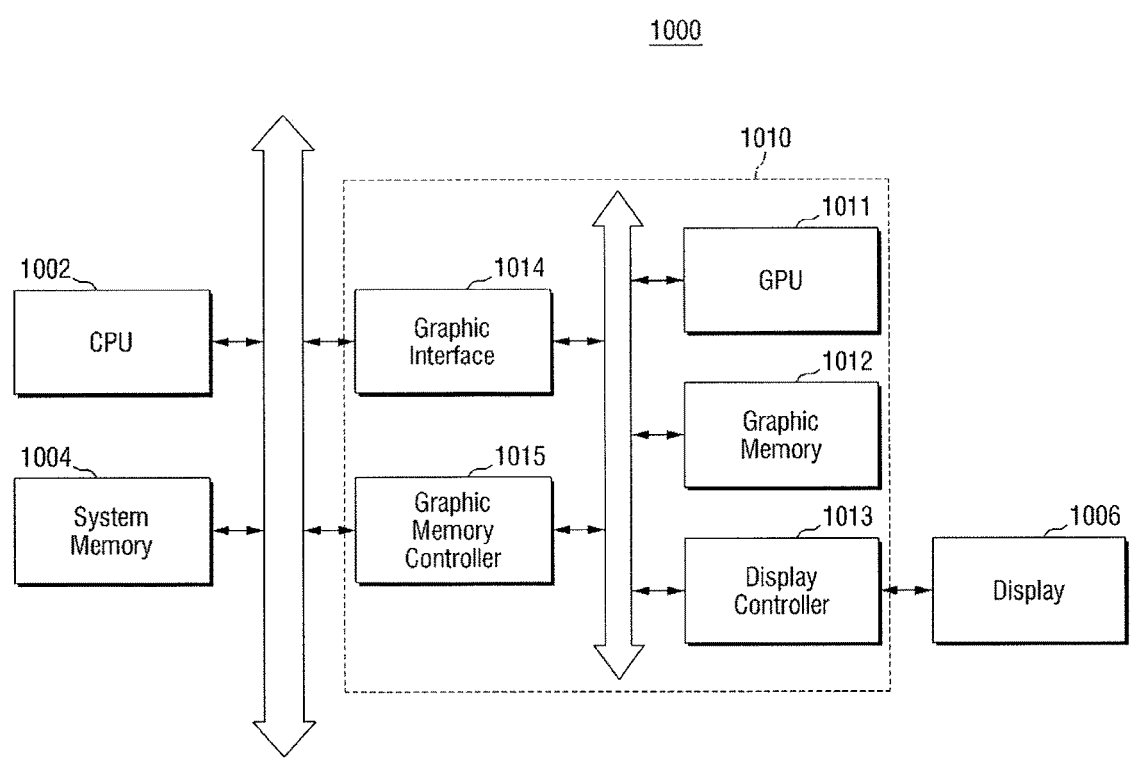
FIG. 21 illustrates a computing system that includes any of the aforementioned embodiments of a semiconductor device.

FIG. 21 illustrates a computing system 1000 which includes one or more of the aforementioned embodiments of a semiconductor device. Referring to FIG. 21, computing system 1000 includes a central processing unit (CPU) 1002, a system memory 1004, a graphic system 1010, and a display 1006.

The central processing unit 1002 may perform operations to drive the computing system 1000. The system memory 1004 may be configured to store data. The system memory 1004 may store data that is processed by the central processing unit 1002. The system memory 1004 may serve as an operating memory of the central processing unit 1002. The system memory 1004 may include one or more volatile memories such as a DDR SDRAM (Double Data Rate Static DRAM) or SDR SDRAM (Single Data Rate SDRAM), and/or one or more nonvolatile memories such as EEPROM (Electrical Erasable Programmable ROM), or a flash memory. Any of the semiconductor devices 1 to 6 according to the above-described embodiments may be adopted as a constituent element of the system memory 1004.

The graphic system 1010 may include a graphic processing unit (GPU) 1011, a graphic memory 1012, a display controller 1013, a graphic interface 1014, and a graphic memory controller 1015. The graphic processing unit 1011 may perform graphic operations required for the computing system 1000. For example, the graphic processing unit 1011 may assemble primitives including at least one vertex, and may perform rendering using assembled primitives.

The graphic memory 1012 may store graphic data that is processed by the graphic processing unit 1011 or graphic data provided to the graphic processing unit 1011. The graphic memory 1012 may serve as an operating memory of the graphic processing unit 1011. Any of the semiconductor devices 1 to 6 according to the above-described embodiments may be adopted as a constituent element of the graphic memory 1012.

The display controller 1013 may control the display 1006 to display rendered image frames. The graphic interface 1014 may perform interfacing between the central processing unit 1002 and the graphic processing unit 1011. The graphic memory controller 1015 may provide a memory access between the system memory 1004 and the graphic processing unit 1011.

The computing system 1000 may further include one or more input devices (such as buttons, a touch screen, and/or a microphone) and/or one or more output devices such as speakers. The computing system 1000 may further include an interface device for exchanging data with an external device by wire or wirelessly. The interface device may include, for example, an antenna or a wire/wireless transceiver.

According to one embodiment, the computing system 1000 may be a certain computing system such as a mobile phone, a smart phone, a personal digital assistant (PDA), a desktop computer, a notebook computer, or a tablet.

Figure 22:
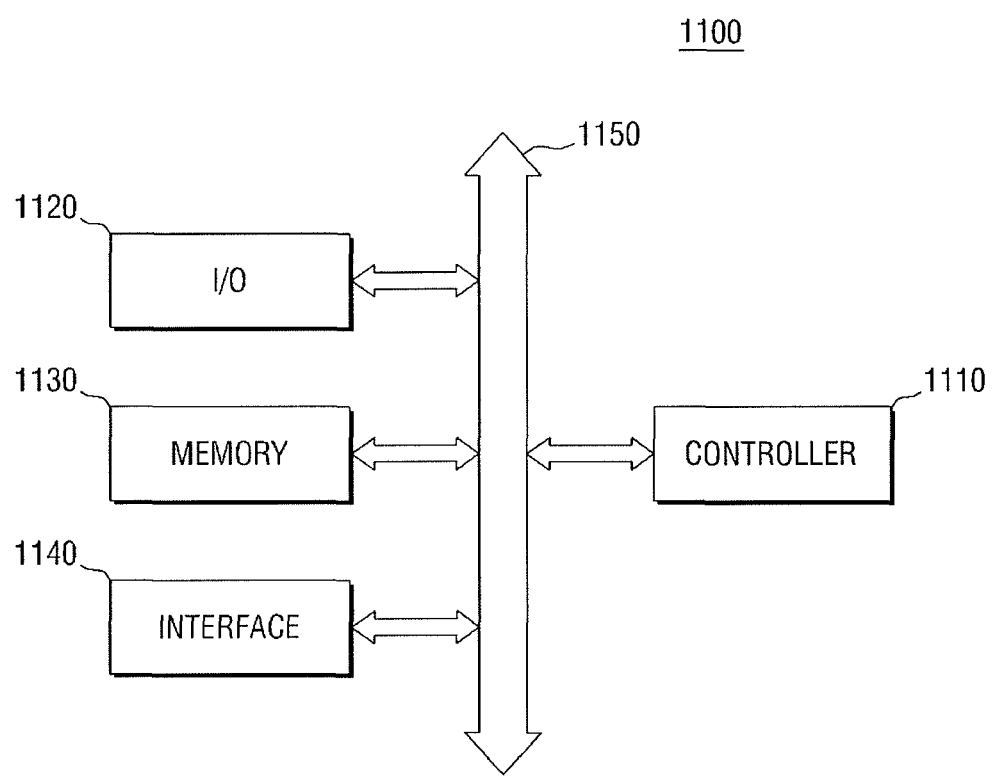
FIG. 22 illustrates an electronic system that includes any of the aforementioned embodiments of a semiconductor device.

FIG. 22 illustrates an electronic system that includes a semiconductor device in accordance with one or more of the aforementioned embodiments. Referring to FIG. 22, electronic system 1100 includes a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver.

The electronic system 1100 may include a high-speed DRAM and/or SRAM as an operating memory for improving the operation of the controller 1110. Any of the semiconductor devices 1 to 6 may be adopted as the operating memory. Further, any of the semiconductor devices 1 to 6 may be provided in the memory 1130, or may be provided as a part of the controller 1110 or the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 23:
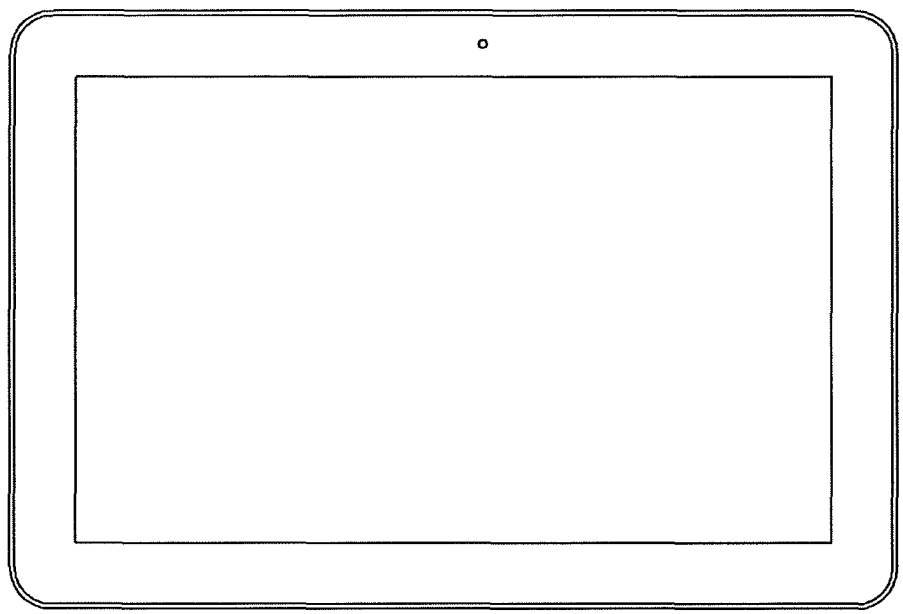
FIGS. 23 to 25 illustrate examples of semiconductor systems that may include any of the aforementioned embodiments of a semiconductor device.
Figure 24:
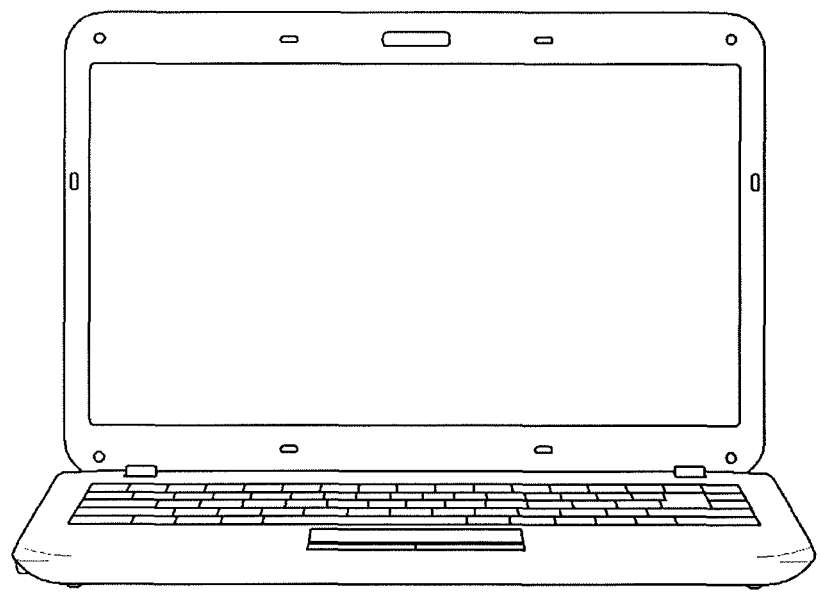
Figure 25:
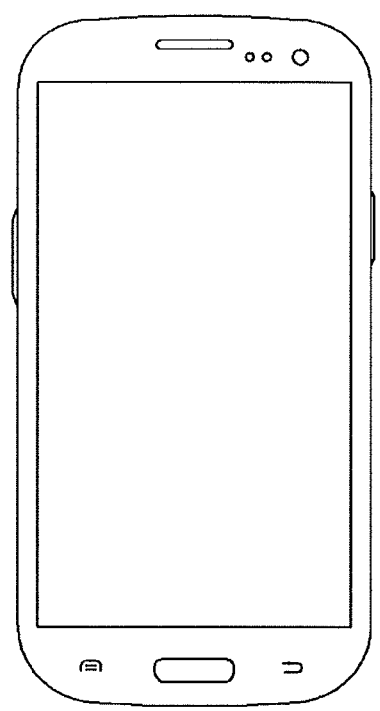

FIGS. 23 to 25 illustrate different embodiments of semiconductor systems which may include a semiconductor device according to one or more of the aforementioned embodiments. FIG. 23 illustrates a tablet PC 1200, FIG. 24 illustrates a notebook computer 1300, and FIG. 25 illustrates a smart phone 1400. At least one of the semiconductor devices 1 to 6 may be used in the tablet PC 1200, the notebook computer 1300, or the smart phone 1400.

The semiconductor device may also be applied to other types of integrated circuit devices that have not been specifically mentioned herein. For example, in some embodiments, the semiconductor system may be implemented as a computer, UMPC (Ultra Mobile PC), workstation, net-book, PDA (Personal Digital Assistant), portable computer, wireless phone, mobile phone, e-book, PMP (Portable Multimedia Player), portable game machine, navigation device, black box, digital camera, 3D television set, digital audio recorder, digital audio player, digital picture recorder, digital picture player, digital video recorder, or digital video player.

One or more of the aforementioned embodiments provides a semiconductor device which can achieve miniaturization. One or more of the aforementioned embodiments also provide a method for fabricating a semiconductor device which can achieve miniaturization. Since, in one or more embodiments, the first memory cell region and the second memory cell region share an active base, a dummy active base is not needed in one or more embodiments, allowing miniaturization of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
first and second memory cells and adjacent to each other with no intervening memory cell on a substrate, wherein each of the first and second memory cells have an odd number of active fins;
at least one active base and a shallow trench isolation sequentially laminated at a boundary between the first and second memory cells;
first and second active fins on respective sides of the shallow trench isolation, the first and second active fins projecting from the active base;
a gate electrode; and
at least one deep trench isolation on one side of the active base,
wherein the first active fin is in the first memory cell and the second active fin is in the second memory cell, wherein the first and second active fins extend in a first direction along the boundary between the first and second memory cells, and wherein the gate electrode extends from the first and second active fins in a second direction that crosses the first direction, wherein the first and second memory cells are symmetrically arranged with respect to each other relative to the boundary.

2. The semiconductor device as claimed in claim 1, wherein a width of the active base is larger than a width of each of the first and second active fins.

3. The semiconductor device as claimed in claim 2, further comprising:
a plurality of active bases,
wherein the first and second active fins are separated by the shallow trench isolation, and wherein at least two of the plurality of active bases are separated by the deep trench isolation.

4. The semiconductor device as claimed in claim 1, further comprising:
a gate insulating film between the gate electrode and the first and second active fins; and
a spacer on at least one side of the gate electrode, wherein the gate insulating film extends along a side wall of the spacer.

5. The semiconductor device as claimed in claim 4, wherein the gate electrode includes a gate metal and a work function metal.

6. The semiconductor device as claimed in claim 4, further comprising:
a source region and a drain region respectively formed on the first and second active fins adjacent to the gate electrode, wherein upper surfaces of the source region and the drain region are higher than a lower surface of the gate insulating film.

7. The semiconductor device as claimed in claim 6, wherein a part of at least one of the source region or the drain region is adjacent to a lower portion of the spacer.

8. The semiconductor device as claimed in claim 1, wherein the substrate is an insulating substrate.

9. The semiconductor device as claimed in claim 1, wherein a same type of memory device is included in the first memory cell and in the second memory cell.

10. The semiconductor device as claimed in claim 9, wherein the memory device includes a static random access memory.

* * * * *